(12) United States Patent
Kim

(10) Patent No.: US 8,703,533 B2
(45) Date of Patent: Apr. 22, 2014

(54) SEMICONDUCTOR PACKAGE AND METHOD FOR MANUFACTURING THE SAME

(75) Inventor: Si Han Kim, Yongin-si (KR)

(73) Assignee: SK Hynix Inc., Gyeonggi-do (KR)

( * ) Notice: Subject to any disclaimer, the term of this patent is extended or adjusted under 35 U.S.C. 154(b) by 207 days.

(21) Appl. No.: 13/339,100

(22) Filed: Dec. 28, 2011

(65) Prior Publication Data

US 2012/0205796 A1    Aug. 16, 2012

(30) Foreign Application Priority Data

Feb. 15, 2011  (KR) .......................... 10-2011-0013242

(51) Int. Cl.
*H01L 21/50*  (2006.01)

(52) U.S. Cl.
USPC ..... 438/106; 438/108; 438/127; 257/E21.499

(58) Field of Classification Search
USPC ........... 438/121, 106, 108, 127; 257/E21.499
See application file for complete search history.

(56) References Cited

U.S. PATENT DOCUMENTS

| | | | | |
|---|---|---|---|---|
| 6,468,448 | B1 * | 10/2002 | Amami et al. ................. | 252/506 |
| 7,218,007 | B2 * | 5/2007 | Shi et al. ........................ | 257/778 |
| 8,368,214 | B2 * | 2/2013 | Tam et al. ...................... | 257/738 |
| 2002/0011677 | A1 * | 1/2002 | Yokoi et al. ................... | 257/782 |
| 2004/0012098 | A1 * | 1/2004 | Yamazaki et al. ............. | 257/778 |
| 2010/0320596 | A1 * | 12/2010 | Eom et al. ...................... | 257/737 |

FOREIGN PATENT DOCUMENTS

| KR | 1998-044255 A | 9/1998 |
|---|---|---|
| KR | 1020060037309 A | 5/2006 |

* cited by examiner

*Primary Examiner* — Thanh Nguyen

(74) *Attorney, Agent, or Firm* — William Park & Associates Patent Ltd.

(57) ABSTRACT

A semiconductor package includes a substrate having a connection terminal with a groove on its surface. Nanopowder may be disposed on a bottom of the groove. A semiconductor chip may be flip-chip bonded to the substrate by the nanopowder. A filler member may be interposed between the substrate and the semiconductor chip.

6 Claims, 3 Drawing Sheets

SEMICONDUCTOR PACKAGE AND METHOD FOR MANUFACTURING THE SAME

CROSS-REFERENCE TO RELATED APPLICATIONS

The present application claims priority to Korean patent application number 10-2011-0013242 filed on Feb. 15, 2011, which is incorporated by reference in its entirety.

BACKGROUND OF THE INVENTION

The present invention relates to a semiconductor package and a method for manufacturing the same, and more particularly, to a method for manufacturing a semiconductor package that can improve mounting reliability.

In general, a semiconductor package is manufactured by mounting a semiconductor chip to a substrate. In such a conventional package structure, electrical connection between the semiconductor chip and the substrate is mainly implemented through wire bonding.

However, in the conventional semiconductor package in which electrical connection is implemented through wire bonding, wires are likely to snap in a subsequent molding process, and limitations exist in reducing the thickness and size of the package due to the loops and lengths of the wires.

Also, since signal paths depend upon the lengths of the wires, it is difficult to secure electrical characteristics of the package. To alleviate this, a flip chip bonding technology of connecting a semiconductor chip and a substrate using bumps has been suggested.

According to the flip chip bonding technology, a semiconductor chip is mechanically attached to a substrate and is electrically connected with the electrodes of the substrate by bumps formed on the bonding pads of the semiconductor chip.

Accordingly, in the case of a package to which the flip chip bonding technology is applied, the occurrence of a fail due to snapping of a wire may be fundamentally solved.

Also, the thickness and the size of the package may be reduced, and in particular, a signal path length may be minimized, whereby the electrical characteristics of the package may be improved.

When manufacturing a semiconductor package using the flip chip bonding technology, studs or pillars are first formed on the bonding pads of the semiconductor chip using gold or copper, solders are formed directly on the bond fingers of the substrate or with separate studs formed, and the semiconductor chip and the substrate are aligned such that the bonding pads and the bond fingers are in one to one correspondence. Then, the two objects are joined with each other by applying, for example, pressure or heat.

Nevertheless, in the conventional art, because the separate studs should be formed on the bond fingers of the substrate, additional processes and additional costs are required.

Furthermore, in the conventional art, when the semiconductor chip and the substrate are aligned and joined with each other, poor junctions may result due to misalignment and unevenness between bumps caused by the warpage of the semiconductor chip. Accordingly, junction coupling force between the semiconductor chip and the substrate is likely to decrease.

BRIEF SUMMARY OF THE INVENTION

Embodiments of the present invention are directed to a semiconductor package that can improve junction coupling force between a substrate and semiconductor chips and a method for manufacturing the same.

Also, embodiments of the present invention are directed to a semiconductor package that can improve mounting reliability by improving junction coupling force and a method for manufacturing the same.

In one embodiment of the present invention, a semiconductor package includes a substrate having a connection terminal with a groove on its surface. Nanopowder may be disposed on the groove. A semiconductor chip may be flip-chip bonded to the substrate by the nanopowder. Filler member may be interposed between the substrate and the semiconductor chip.

The connection terminal may have a groove on its surface, and nanopowder may be disposed on a bottom of the groove.

The nanopowder may include one or more of copper (Cu) and silver (Ag).

The semiconductor chip may be disposed face-down on the substrate and may be electrically connected with the connection terminal by the nanopowder.

The connection members of the semiconductor chip may include a bonding pad, and a bump disposed on the bonding pad.

The filler member may include any one of an NCA (non-conductive adhesive), an NCF (non-conductive film), an ACF (anisotropic conductive film), and an ABF (Ajinomoto build-up film).

The filler member may have an opening into which the connection members of the semiconductor chip fit.

In another embodiment of the present invention, a method for manufacturing a semiconductor package includes disposing a substrate having a connection terminal with a groove, and disposing nanopowder on a bottom of the groove. A filler member may be disposed on the substrate. A semiconductor chip that has connection members physically contacting the connection terminal may be disposed on the filler member. The nanopowder may be sintered to electrically connect the connection terminal of the substrate and the connection members of the semiconductor chip with each other.

The connection terminal may have a groove on the surface and the nanopowder may be disposed on a bottom of the groove.

The nanopowder may be disposed onto the surface of the connection terminal using an inkjet process.

The nanopowder may include one or more of copper (Cu) and silver (Ag).

The sintering may be performed at a temperature of substantially 110~120° C.

The semiconductor chip may be disposed face-down on the substrate and may be electrically connected with the connection terminal by the nanopowder.

The connection members of the semiconductor chip may include a bonding pad, and a bump disposed on the bonding pad.

The filler member may include any one of an NCA (non-conductive adhesive), an NCF (non-conductive film), an ACF (anisotropic conductive film), and an ABF (Ajinomoto build-up film).

DESCRIPTION OF SPECIFIC EMBODIMENTS

Specific embodiments of the present invention will be described in detail with reference to the accompanying drawings.

It is to be understood that the drawings are not necessarily to scale and in some instances proportions may have been exaggerated in order to more clearly depict certain features of the invention.

Figure 1:
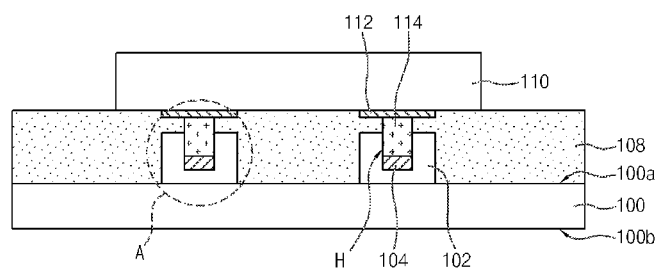
FIG. 1 is a cross-sectional view illustrating a semiconductor package in accordance with an embodiment of the present invention.

FIG. 1 is a cross-sectional view illustrating a semiconductor package in accordance with an embodiment of the present invention. In FIG. 1, part A is shown enlarged for the sake of clarity and for detailed illustration of the characterizing features of the embodiment of the present invention.

Referring to FIG. 1, the semiconductor package 150 in accordance with an embodiment of the present invention includes a substrate 100 having a connection terminal 102 which is defined with a groove H on its surface, nanopowder 104, a semiconductor chip 110, and a filler member 108.

In detail, the substrate 100 has an upper surface 100a and a lower surface 100b. The connection terminal 102 with the groove H is disposed on the upper surface 100a.

The nanopowder 104 is disposed on the surface of the connection terminal 102 that has the groove H. The nanopowder 104 may be disposed on the bottom of the groove H. The nanopowder 104 may include conductive material such as, for example, one or more of copper (Cu) and silver (Ag) and may realize an ultrafine pitch of 10~50 μm.

The semiconductor chip 110 is flip-chip bonded to the substrate 100 by the nanopowder 104 and connection members 112 and 114. For example, the semiconductor chip 110 is disposed face down on the substrate 100 and is electrically connected with the connection terminal 102 by the nanopowder 104. The connection members 112 and 114 may be a bonding pad 112 and a bump 114.

The filler member 108 is interposed between the substrate 100 and the semiconductor chip 110 and has an opening into which the connection members 112 and 114 of the semiconductor chip 110 are inserted. The filler member 108 may be, for example, any one of an NCA (non-conductive adhesive), an NCF (non-conductive film), an ACF (anisotropic conductive film), and an ABF (Ajinomoto build-up film).

As is apparent from the above descriptions, in an embodiment of the present invention, a substrate has a connection terminal defined with a groove, nanopowder disposed on the bottom of the groove of the connection terminal, and a semiconductor chip attached using the nanopowder. Therefore, it is possible to prevent the occurrence of a phase change that may otherwise occur when performing a junction process such as annealing in the conventional art, whereby warpage of the semiconductor chip due to expansion and contraction in the volume of the semiconductor chip may be avoided. As a consequence, in an embodiment of the present invention, junction coupling force between the substrate and the semiconductor chip may be improved and thus mounting reliability may be improved.

A method for manufacturing a semiconductor package in accordance with another embodiment of the present invention will be described.

FIGS. 2A to 2D are cross-sectional views explaining a method for manufacturing a semiconductor package in accordance with another embodiment of the present invention.

Figure 2A:
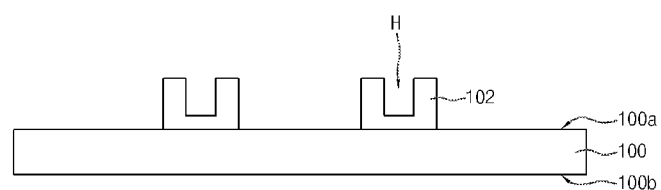
FIGS. 2A to 2D are cross-sectional views explaining a method for manufacturing a semiconductor package in accordance with another embodiment of the present invention.

Referring to FIG. 2A, a substrate 100 having an upper surface 100a and a lower surface 100b is prepared. Then, a connection terminal 102 is disposed on the upper surface 100a of the substrate 100. By patterning the connection terminal 102 partially, for example, a groove H is defined in the connection terminal 102. In order to allow a semiconductor chip (which will be described later) to be electrically connected with the substrate 100, the groove H may be defined at a position where a bump of the connection members of the semiconductor chip is to be formed.

Figure 2B:
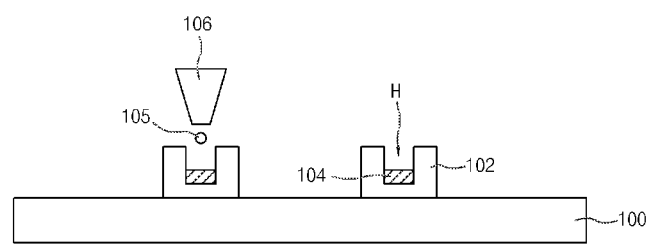

Referring to FIG. 2B, nanopowder 104 fills at least partially the groove H through, for example, an inkjet process using an inkjet nozzle 106. Nanopowder 104 may include conductive material such as, for example, one or more of copper (Cu) and silver (Ag), and may have an ultrafine pitch of 10~50 μm. The reference numeral 105 designates a nanopowder substance.

Figure 2C:
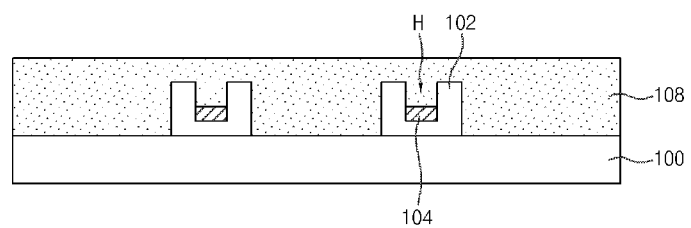

Referring to FIG. 2C, a filler member 108 is disposed to cover the nanopowder 104 disposed on the bottom of the groove H and the connection terminal 102. The filler member 108 may be, for example, any one of an NCA (non-conductive adhesive), an NCF (non-conductive film), an ACF (anisotropic conductive film), and an ABF (Ajinomoto build-up film).

Due to the presence of the filler member 108 in an embodiment of the present invention, an underfill process, which is to be performed to improve the junction coupling force between the substrate 100 and the semiconductor chip, may be omitted.

Figure 2D:
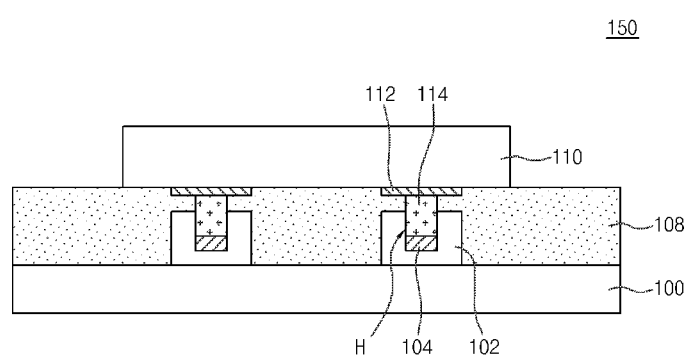

Referring to FIG. 2D, a semiconductor chip 110, having connection members 112 and 114 that physically contact the connection terminal 102, is disposed on the filler member 108. The semiconductor chip 110 is flip-chip bonded to the substrate 100 by the connection members 112 and 114. For example, the semiconductor chip 110 may be disposed face down over the substrate 100 and may be electrically connected with the connection terminal 102 by the nanopowder 104. The connection members 112 and 114 include a bonding pad 112 and a bump 114 disposed on the bonding pad 112.

By sintering the nanopowder 104, the connection terminal 102 of the substrate 100 and the connection members 112 and 114 of the semiconductor chip 110 are electrically connected with each other. The sintering may be performed at a temperature lower than the temperature of an existing solder process. The sintering may be performed for example, at a temperature in the range of 110~120° C.

Sintering may be performed at the temperature of 110~120° C. because the nanopowder 104 may be sintered at the temperature of 110~120° C. That is, the nanopowder 104 may melt at a temperature of 110~120° C. Accordingly, when the nanopowder 104 solidifies, the semiconductor chip 100 may be attached to the substrate 100 to have a firm coupling structure.

Accordingly, in an embodiment of the present invention where sintering is used, it may be possible to prevent the occurrence of a phase change that may otherwise occur when performing a solder process such as annealing in the conventional art. Thus, in an embodiment of the present invention, expansion and contraction in the volume of the semiconductor chip due to the phase change may be avoided, and fails such as warpage of the semiconductor chip and generation of voids may be prevented from occurring.

Thus, in an embodiment of the present invention, junction coupling force between the substrate and the semiconductor chip may be improved and thus mounting reliability may be improved.

In this way, in an embodiment of the present invention, it is possible to realize the semiconductor package 150 in which the semiconductor chip 110 is electrically connected with the substrate 100 and the junction coupling force between the substrate 100 and the semiconductor chip 110 is improved.

Meanwhile, although not shown in a drawing, manufacture of the semiconductor package 150 may be completed by forming external connection terminals such as solder balls on the bottom surface 100b of the substrate 100.

Although specific embodiments of the present invention have been described for illustrative purposes, those skilled in the art will appreciate that various modifications, additions, and substitutions are possible without departing from the scope and the spirit of the invention as disclosed in the accompanying claims.

What is claimed is:

1. A method for manufacturing a semiconductor package, comprising:
    preparing a substrate having a connection terminal defined with a groove on its surface;
    disposing nanopowder on a bottom of the groove of the connection terminal;
    disposing a filler member on the substrate;
    disposing a semiconductor chip, having connection members that physically contact with the connection terminal, on the filler member; and
    electrically connecting the connection terminal of the substrate and the connection members of the semiconductor chip with each other by sintering the nanopowder.

2. The method according to claim 1, wherein the nanopowder is disposed onto the surface of the groove through an inkjet process.

3. The method according to claim 1, wherein the nanopowder includes at least one of copper (Cu) and silver (Ag).

4. The method according to claim 1, wherein the sintering is performed at a temperature of substantially 110~120° C.

5. The method according to claim 1, wherein the connection members of the semiconductor chip comprise a bonding pad, and a bump disposed on the bonding pad.

6. The method according to claim 1, wherein the filler member comprises any one of an NCA (non-conductive adhesive), an NCF (non-conductive film), an ACF (anisotropic conductive film), and an ABF (Ajinomoto build-up film).

* * * * *